US008094437B2

(12) United States Patent
Guo et al.

(10) Patent No.: US 8,094,437 B2
(45) Date of Patent: Jan. 10, 2012

(54) ELECTRONIC DEVICE AND OPERATIVE PUSH BUTTON THEREOF

(75) Inventors: Shi-Kun Guo, Shenzhen (CN); Ke-Hui Peng, Shenzhen (CN); Guo-Ping Yao, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 647 days.

(21) Appl. No.: 12/239,828

(22) Filed: Sep. 29, 2008

(65) Prior Publication Data

US 2009/0159411 A1 Jun. 25, 2009

(30) Foreign Application Priority Data

Dec. 21, 2007 (CN) .......................... 2007 1 0203332

(51) Int. Cl.
*H05K 7/14* (2006.01)

(52) U.S. Cl. ................................... 361/679.01; 200/296

(58) Field of Classification Search ............. 361/679.01, 361/679.02, 679.55, 679.56, 679.58; 455/575.1-575.4; 248/917-924; 200/296

See application file for complete search history.

(56) References Cited

U.S. PATENT DOCUMENTS 6,160,232 A * 12/2000 Lin .............................. 200/341
7,094,983 B2 * 8/2006 Tsunemoto .................. 200/339
7,335,842 B2 2/2008 Guo et al.
7,661,732 B2 * 2/2010 Hsu et al. .................. 292/251.5
2005/0260022 A1 11/2005 Lu

FOREIGN PATENT DOCUMENTS

JP 62-140633 U 9/1987
TW I280091 B 4/2007

* cited by examiner

*Primary Examiner* — Jinhee Lee
*Assistant Examiner* — Ingrid Wright
(74) *Attorney, Agent, or Firm* — Altis Law Group, Inc.

(57) ABSTRACT

An electronic device includes a shell defining a space and an opening therein. A fixing pole extends into the space from an inner surface of the shell adjacent to the opening. A circuit board is received in the space, and defines a through hole corresponding to the fixing pole. A push button is arranged in the shell, and includes a button body extending into the opening of the shell and being exposed to the outside, a fixing member, and a connecting member interconnecting the fixing member and the button body. The fixing member defines a fixing hole receiving the fixing pole therein. Two opposite sides of the fixing member abut against an inner surface of the shell and the circuit board, respectively. A locking member extends through the through hole and the fixing hole into the fixing pole to assemble the circuit board, the push button to the shell.

14 Claims, 3 Drawing Sheets

ELECTRONIC DEVICE AND OPERATIVE PUSH BUTTON THEREOF

BACKGROUND

1. Field of the Disclosure

The disclosure relates to an electronic device, and more particularly relates to a push button of the electronic device.

2. Description of Related Art

Due to the continuous development of electronic techniques and rapid developments of digital technologies, electronic devices, such as notebook computers, mobile phones, personal digital assistants (PDAs), digital versatile disks (DVDs) and the like, have become widely used by consumers.

Usually, the electronic device has a shell, a circuit board with electronic components arranged thereon and enclosed in the shell, and a push button on the shell. Users can depress the push button to perform operation of the electronic device. The push button includes a button body exposed to the outside, an actuator extending from the button body towards the circuit board, and a fixing portion located at a lateral side of the button body. A pole extends inwardly from the shell and abuts against the fixing portion of the push button to limit movement of the push button. In this situation, an end surface of the pole acts as a datum plane for mounting the push button. However, a contacting surface of the pole and the fixing portion of the push button is away from the button body along an axial direction of the button body, and an area of the contacting surface is limited, thus assembly of the push button is usually inaccurate.

For the foregoing reasons, therefore, there is a need in the art for an electronic device with an improved push button which overcomes the above-mentioned problems.

SUMMARY

According to an exemplary embodiment, an electronic device includes a shell having a base and a cover cooperatively defining a space therebetween. An opening is defined in the cover. A fixing pole extends from an inner surface of the cover adjacent to the opening. A circuit board is received in the space of the shell, and defines a through hole corresponding to the fixing pole of the cover. A push button is received in the space of the shell, and arranged between the cover and the circuit board. The push button includes a button body extending into the opening of the shell and expose to the outside, a fixing member, and a connecting member interconnecting the fixing member and the button body. The fixing member defines a fixing hole receiving the fixing pole of the cover therein. Two opposite sides of the fixing member abut against an inner surface of the cover and the circuit board, respectively. A locking member extends through the through hole of the circuit board, the fixing hole of the fixing member of the push button and into the fixing pole of the cover to assemble the circuit board and the push button to the cover of the shell.

Other advantages and novel features of the disclosure will be drawn from the following detailed description of the exemplary embodiments of the disclosure with attached drawings.

DETAILED DESCRIPTION OF THE EMBODIMENTS

Figure 1:
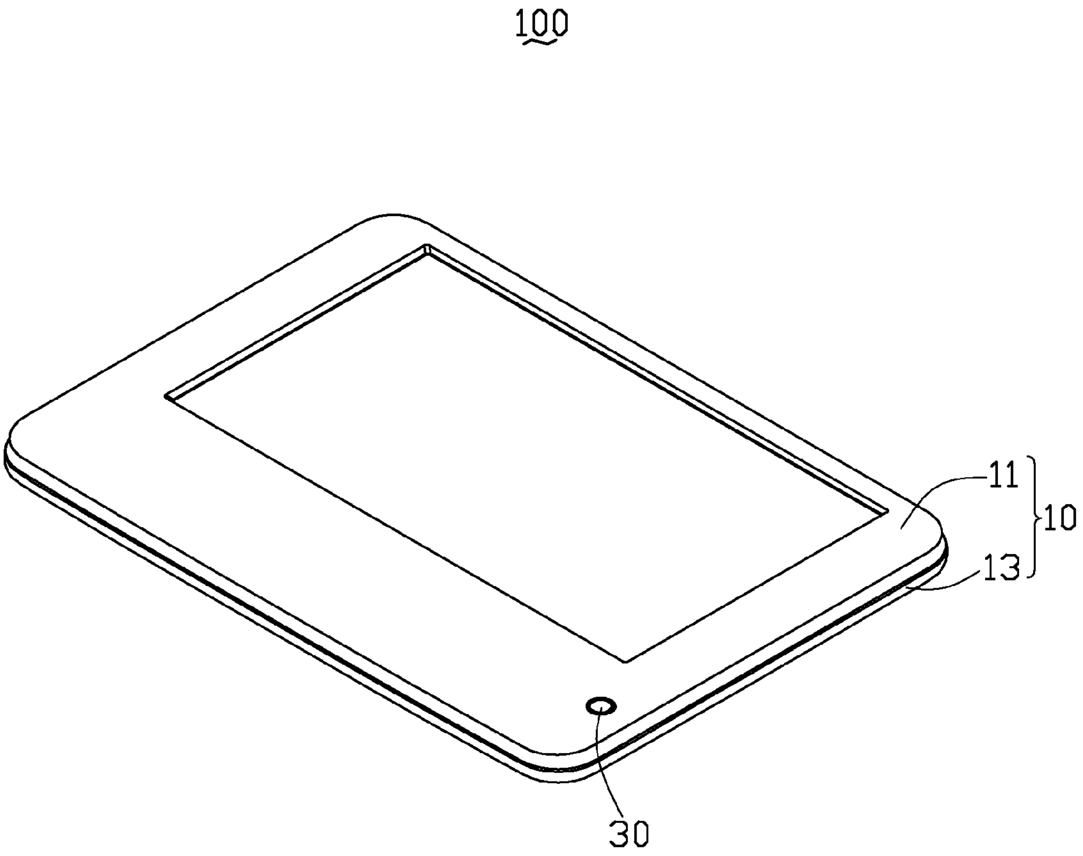
FIG. 1 is an isometric view of an electronic device according to an exemplary embodiment.
Figure 2:
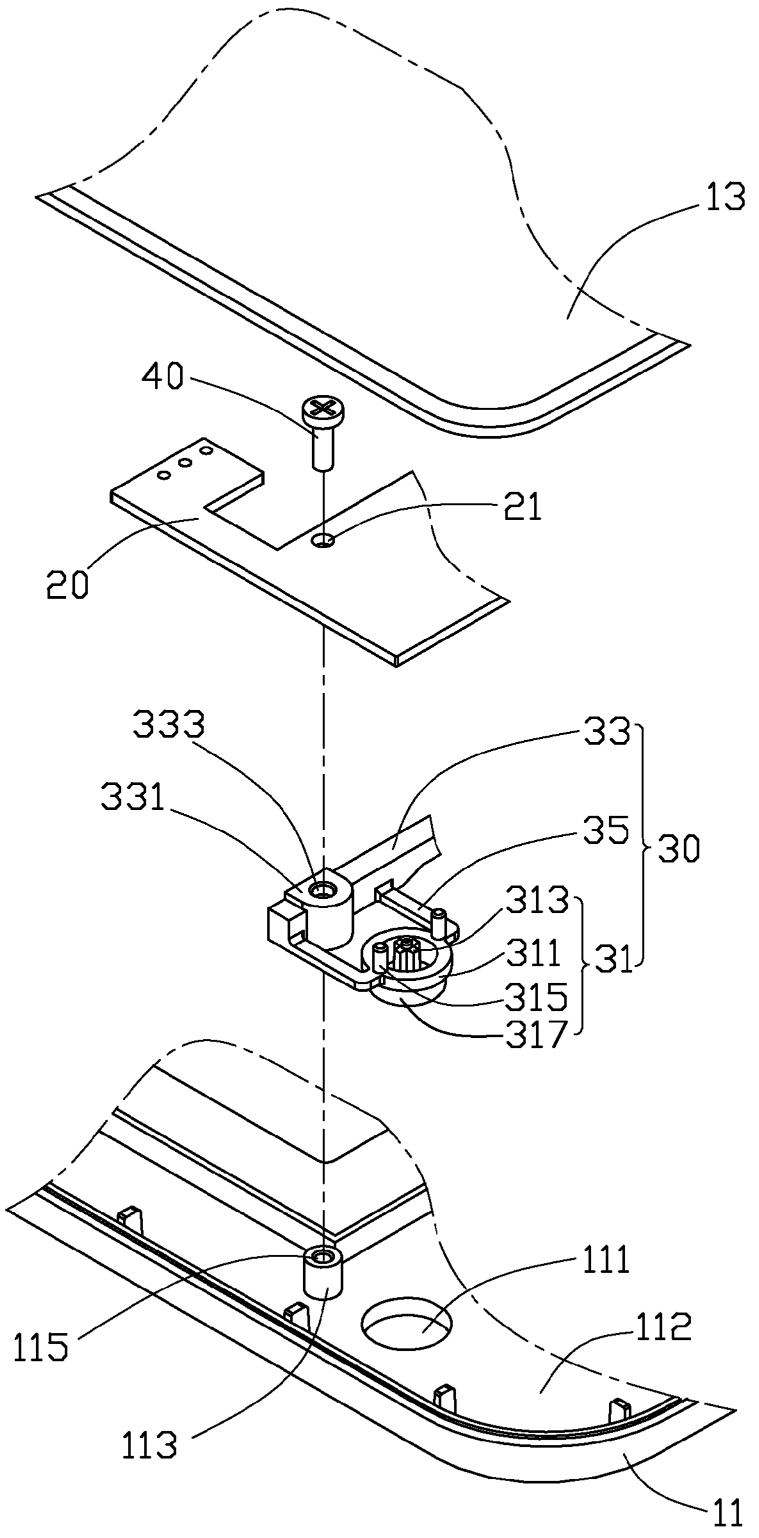
FIG. 2 is an exploded view of the electronic device of FIG. 1 viewed from another aspect.
Figure 3:
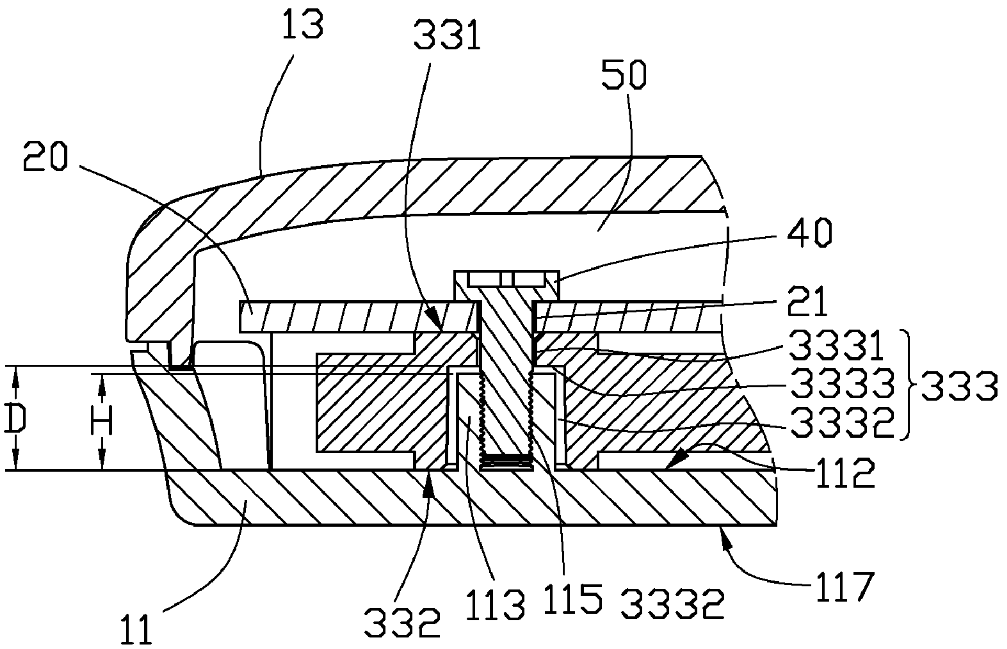
FIG. 3 is an assembled, cross-sectional view of the electronic device of FIG. 2.

Referring to FIGS. 1 through 3, an electronic device 100 according to an exemplary embodiment includes a shell 10, a circuit board 20, a push button 30, and a locking member 40.

The shell 10 includes a base 13, and a cover 11 arranged on the base 13. The cover 11 and the base 13 cooperatively define a space 50 (FIG. 3) therebetween for receiving the circuit board 20, the push button 30, the locking member 40, and other electronic elements therein. A circular hole 111 extends through the cover 11 from an outer surface 117 to an inner surface 112 for receiving the push button 30. A fixing pole 113 extends inwardly from an inner surface 112 towards the base 13. The fixing pole 113 is located near the circular hole 111. A screw hole 115 is formed at a free end of the fixing pole 113.

The circuit board 20 is arranged between the cover 11 and the base 13, and is approximately parallel to the bottom portion of the cover 11. A through hole 21 is defined in the circuit board 20 corresponding to the screw hole 115 of the fixing pole 113. The through hole 21 has a diameter approximately the same as a diameter of the screw hole 115, i.e., an inner diameter of the fixing pole 113. Accordingly, the diameter of the through hole 21 is smaller than an outer diameter of the fixing pole 113. The locking member 40 is configured for extending through the through hole 21 of the circuit board 20 and engaging with the screw hole 115 of the shell 10. In this embodiment, the locking member 40 is a screw. An outer diameter of the locking member 40 is approximately the same as the inner diameter of the fixing pole 113.

The push button 30 is arranged between the circuit board 20 and the cover 11 of the shell 10. The push button 30 includes a button body 31, a fixing member 33 for assembling the button body 31 to the cover 11 of the shell 10, and a connecting member 35 interconnecting the button body 31 and the fixing member 33. The button body 31 includes a circular-shaped operation portion 317 having a size substantially the same as that of the circular hole 111 of the cover 11 and extending through the circular hole 111 to an outer surface of the shell 10 to receive operations. An annular flange 311 is formed at an inner side of the operation portion 317 and has an outer diameter greater than that of the operation portion 317. An actuator 313 extends from a center of the operation portion 317 towards the circuit board 20, and is configured for actuating (opening and closing) circuits of the circuit board 20. A pair of restricting legs 315 extend from the flange 311 of the button body 31 towards the circuit board 20. The restricting legs 315 are symmetrically located on the flange 311. The pair of restricting legs 315 are columnar, and are configured for protecting the circuits of the circuit board 20. Each restricting leg 315 is longer than the actuator 313.

The fixing member 33 is formed at a lateral side of the button body 31, and is located corresponding to the fixing pole 113 of the cover 11 of the shell 10. The fixing member 33 includes a first surface 331 adjacent to the circuit board 20, and a second surface 332 opposite to the first surface 331. A fixing hole 333 extends through the fixing member 33 from the first surface 331 to the second surface 332. The fixing hole 333 includes a first portion 3331 adjacent to the first surface 331, and a second portion 3332 adjacent to the second surface 332 with a diameter larger than that of the first portion 3331. A step 3333 is thus formed between the first and second portions 3331, 3332. The diameter of the first portion 3331 is substantially the same as that of the locking member 40, and the diameter of the second portion 3332 is greater than the outer diameter of the fixing pole 113. A depth of the second portion 3332 "D" is deeper than a height of the fixing pole 113 "H", and thus an entire of the second portion 3332 of the fixing hole 333 can be received in the fixing pole 113. The connecting member 35 connects the fixing member 33 to the button body 31, and thus the fixing member 33 and the connecting member 35 are integral. The connecting member 35 includes a pair of parallel cantilever beams located at two opposite sides of the button body 31. The two cantilever beams are symmetric to the button body 31.

During assembly, the push button 30 is arranged between the cover 11 of the shell 10 and the circuit board 20 with the second surface 332 of the fixing member 33 and the button body 31 facing to the inner surface 112 of the cover 11. The operation portion 317 of the button body 31 extends into the circular hole 111 of the cover 11, and the fixing pole 113 of the cover 11 extends into the fixing hole 333 of the fixing member 33. Then the locking member 40 extends through the through hole 21 of the circuit board 20, the fixing hole 333 of the fixing member 33, and finally screwed into the screw hole 115 of the fixing pole 113. Thus the circuit board 20 and the push button 30 are assembled to the cover 11 of the shell 10. Because the height of the fixing pole 113 is shorter than the depth of the second portion 3332, and the outer diameter of the fixing pole 113 is smaller than the diameter of the second portion 3332 of the fixing hole 333, when the fixing pole 113 is received in the second portion 3332 of the fixing hole 333, the free end of the fixing pole 113 is spaced from the step 3333 of the fixing member 33, and the second surface 332 of the fixing member 33 abuts against the inner surface 112 of the cover 11. The inner surface 112 of the cover 11 acts as a datum plane for mounting the push button 30. Thus a contact surface of the push button 30 and the cover 11 has a large area, and a distance between the contacting surface and the outer surface of the button body 31 is much smaller than a distance between the outer surface of the button body and the contacting surface of a conventional push button which is at the bottom end of the pole. As a result, assembling the push button 30 onto the shell can accurately and efficiently be performed.

When the electronic device 100 is in use, the operation portion 317 of the button body 31 is depressed with a force, the actuator 313 moves towards and comes in contact with the circuit board 20, thus the circuits of the circuit board 20 are actuated. As the actuator 313 moves downward, the restricting leg 315 also moves toward the circuit board 20. Because the restricting leg 315 has a length greater than the actuator 313, after the actuator 313 contacts to the circuit board 20, the restricting leg 315 limits further movement of the button body 31 towards the circuit board 20, thus preventing the push button 30 and the circuit board 20 from damaging each other. In addition, as the pair of cantilever beams formed between the fixing member 33 and the button body 31, the force on the arm between the button body 31 and the fixing member 33 increases. Thus even if the force on the push button 30 is small, the force would be sufficient to move the actuator 313 of the push button 30 to touch the circuit board 20.

It is to be understood, however, that even though numerous characteristics and advantages of the disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An electronic device, comprising:

a shell defining a space therein, an opening being defined in the shell and communicating with the space; and a push button received in the space of the shell, comprising a button body extending into the opening of the shell and being exposed to the outside, a fixing member fixedly assembled to the shell and abutting against an inner surface of the shell defining a fixing hole, a connecting member interconnecting the fixing member and the button body, a fixing portion extending from the shell fixedly assembled to the push button, and a locking member extending through the fixing hole and engaging with the fixing portion to assemble the push button to the fixing portion; wherein the fixing hole comprises a first portion and a second portion having a diameter larger than that of the first portion, the fixing portion of the cover being received in the second portion of the fixing hole, a length of the fixing portion below a depth of the second portion of the fixing hole.

2. The electronic device of claim 1, wherein the shell comprises a base and a cover arranged on the base, the opening being defined in the cover of the shell.

3. The electronic device of claim 2, wherein the fixing portion extends from the inner surface of the cover.

4. The electronic device of claim 3, wherein the locking member engages with the fixing portion to assemble the push button to the fixing portion of the cover.

5. The electronic device of claim 4, wherein a screw hole is defined in the fixing portion of the cover, and the locking member is a screw, the screw being threadedly engaged into the screw hole of the fixing portion of the cover.

6. The electronic device as claimed in claim 2, wherein the electronic device further comprises a circuit board arranged between the base and the cover in capable of being actuated by the push button.

7. The electronic device as claimed in claim 6, wherein the electronic device further comprises a pair of restricting legs disposed on the push button for limiting the further movement of the push button after the circuit board is actuated.

8. The electronic device as claimed in claim 7, wherein each restricting leg protrudes from the push button and extends towards the circuit board, and the push button comprises an actuator for actuating the circuit board, and each restricting leg is longer than the actuator.

9. The electronic device of claim 1, wherein the connecting member comprises a pair of cantilever beams located at two opposite sides of the button body.

10. An electronic device, comprising:

a shell comprising a base and a cover arranged on the base, a space being defined between the base and the cover, an opening being defined in the cover and communicating with the space, a fixing pole extending from an inner surface of the cover, the fixing pole located adjacent to the opening;

a circuit board being received in the space of the shell, a through hole being defined in the circuit board corresponding to the fixing pole of the cover;

a push button received in the space of the shell, and arranged between the cover and the circuit board, the push button comprising a button body extending into the opening of the shell and being exposed to the outside, a fixing member defining a fixing hole receiving the fixing pole of the cover therein, and a connecting member interconnecting the fixing member and the button body, two opposite sides of the fixing member abutting against the inner surface of the cover and the circuit board, respectively; and a locking member extending through the through hole of the circuit board, the fixing hole of the fixing member of the push button into the fixing pole of the cover to assemble the circuit board and the push button to the shell, wherein the fixing hole comprises a first portion and a second portion having a diameter larger than that of the first portion, a diameter of the locking member being substantially the same as that of the first portion, the fixing portion of the cover being received in the second portion of the fixing hole, a length of the fixing portion below a depth of the second portion of the fixing hole.

11. The electronic device of claim 10, wherein a screw hole is defined in the fixing pole of the cover, and the locking member is a screw, the screw being threadedly engaged into the screw hole of the fixing pole of the cover.

12. The electronic device of claim 10, wherein the connecting member comprises a pair of cantilever beams located at two opposite sides of the button body.

13. The electronic device as claimed in claim 10, wherein the electronic device further comprises a pair of restricting legs disposed at two opposite sides of the push button for limiting the further movement of the push button after the circuit board is actuated by the push button.

14. The electronic device as claimed in claim 13, wherein the distance between each restricting leg and the circuit board is smaller than the distance between the button body and the circuit board.

* * * * *